United States Patent
Wang et al.

(10) Patent No.: US 6,183,940 B1
(45) Date of Patent: Feb. 6, 2001

(54) METHOD OF RETAINING THE INTEGRITY OF A PHOTORESIST PATTERN

(75) Inventors: Chen-Yu Wang, Sunnyvale; Tseng You Syau; Ching-Kai Lin, both of San Jose, all of CA (US)

(73) Assignee: Integrated Device Technology, Inc., Santa Clara, CA (US)

( * ) Notice: Under 35 U.S.C. 154(b), the term of this patent shall be extended for 0 days.

(21) Appl. No.: 09/040,480

(22) Filed: Mar. 17, 1998

(51) Int. Cl.[7] ............... G03F 7/00; H01L 21/30; C23F 1/00
(52) U.S. Cl. ............. 430/328; 430/313; 430/325; 438/695; 438/710; 216/46; 216/49; 216/75
(58) Field of Search .................. 430/313, 325, 430/328; 438/710, 695; 216/45, 46, 49

(56) References Cited

U.S. PATENT DOCUMENTS

| | | | |
|---|---|---|---|
| 4,187,331 | * 2/1980 | Ma | 430/328 |
| 4,450,042 | 5/1984 | Purdes | 156/643 |
| 4,826,754 | 5/1989 | Bobbio | 430/311 |
| 4,978,420 | * 12/1990 | Bach | 156/643 |
| 5,082,524 | 1/1992 | Cathey | 156/643 |
| 5,215,867 | 6/1993 | Stillwagon et al. | 430/323 |
| 5,219,788 | * 6/1993 | Abernathey | 437/187 |
| 5,312,716 | 5/1994 | Unoki et al. | 430/313 |
| 5,326,431 | 7/1994 | Kadomura | 156/659.1 |
| 5,360,693 | 11/1994 | Sebald et al. | 430/313 |
| 5,443,941 | 8/1995 | Bariya et al. | 430/313 |
| 5,487,967 | 1/1996 | Hutton et al. | 430/322 |
| 5,648,198 | 7/1997 | Shibata | 430/296 |
| 5,892,096 | * 4/1999 | Meador | 558/393 |

* cited by examiner

Primary Examiner—Mark F. Huff
Assistant Examiner—Nicole Barreca
(74) Attorney, Agent, or Firm—Skjerven Morrill MacPherson Franklin & Friel

(57) ABSTRACT

A method of retaining the integrity of a photoresist pattern is provided where the patterned photoresist is treated prior to etching the principle layer. The pre-etch treatment encompasses a plasma treatment. In some embodiments employing an anti-reflective coating (ARC) layer, an isolation/protective layer is used to isolate the ARC from the photoresist. In some embodiments, the pre-etch treatment, advantageously provides for patterning the isolation/protection layer.

19 Claims, 2 Drawing Sheets

METHOD OF RETAINING THE INTEGRITY OF A PHOTORESIST PATTERN

BACKGROUND

1. Field of the Invention

This invention relates to a method for manufacturing integrated circuits and, more specifically to a method for retaining the integrity of a photoresist pattern during the manufacture of semiconductor integrated circuits.

2. Related Art

In the manufacture of semiconductor integrated circuits, a variety of photolithographic steps are employed. These photolithographic steps encompass forming a layer of photosensitive material, photoresist, overlying a surface of a semiconductor wafer or substrate and defining a pattern therein. Typically, the pattern formed is used to mask portions of an underlying layer to allow unmasked portions of the underlying layer to be removed. The removal of the material of such underlying layers is often performed using a plasma etching process, for example a reactive ion etch process. While in some etch processes the photoresist layer maintains its integrity, that is little or no photoresist is removed and the cross-sectional profile of the resist remains essentially unchanged, in other etch processes the photoresist is removed at a rate comparable to the removal rate of the underlying layer. This loss of integrity is known to affect the patterning of the underlying layer. For example, in some cases the desired feature sizes, as defined by the original photoresist pattern, are not reproduced. In some embodiments portions of the desired features are missing and in some cases both feature size and presence are affected.

Various attempts have been made to improve photoresist integrity during semiconductor processing. For example, it is generally known that baking the photoresist layer, often referred to as a hard bake, after the pattern is formed and immediately prior to a plasma etch improves integrity. In addition, it is known that a blanket exposure of the patterned photoresist with an ultraviolet (UV) light improves photoresist integrity. It is also known to use both a hard bake and UV exposure in combination to improve photoresist integrity. However, such independent or combined use of bakes and blanket UV exposure are at best marginally acceptable for some necessary etch processes, for example some metal etch processes.

Therefore it would be desirable for there to be a process for forming a patterned photoresist layer with improved integrity for use in some etch processes. It would also be desirable for this process to be readily integrated into standard semiconductor processing.

SUMMARY

A method of retaining the integrity of an as formed pattern of a photoresist layer after a plasma etch process is provided. Embodiments in accordance with the present invention provide a plasma treatment for a patterned photoresist layer. In some embodiments an I-line photoresist is employed; in other embodiments a deep UV (DUV) photoresist is employed.

The plasma treatment of the present invention is advantageously performed prior to a plasma etch process for etching a layer or layers underlying the patterned photoresist. In some embodiments of the present invention the plasma treatment provided additionally serves to etch a silicon oxide layer formed over an underlying metal layer. In some embodiments of the present invention a plasma encompassing a fluorocarbon is employed for the plasma treatment.

BRIEF DESCRIPTION OF THE DRAWINGS

The present invention may be better understood, and its numerous objects, features, and advantages made apparent to those skilled in the art by referencing the accompanying drawings. For ease of understanding and simplicity, where elements are common between illustrations, common numbering of those elements is employed between illustrations.

DETAILED DESCRIPTION

As embodiments of the present invention are described with reference to the drawings, various modifications or adaptations of the specific methods and or structures may become apparent to those skilled in the art. For example, in some embodiments of the present invention, a silicon oxynitride layer is employed in place of a silicon oxide layer. All such modifications, adaptations or variations that rely upon the teachings of the present invention, and through which these teachings have advanced the art, are considered to be within the spirit and scope of the present invention.

Figure 1A:
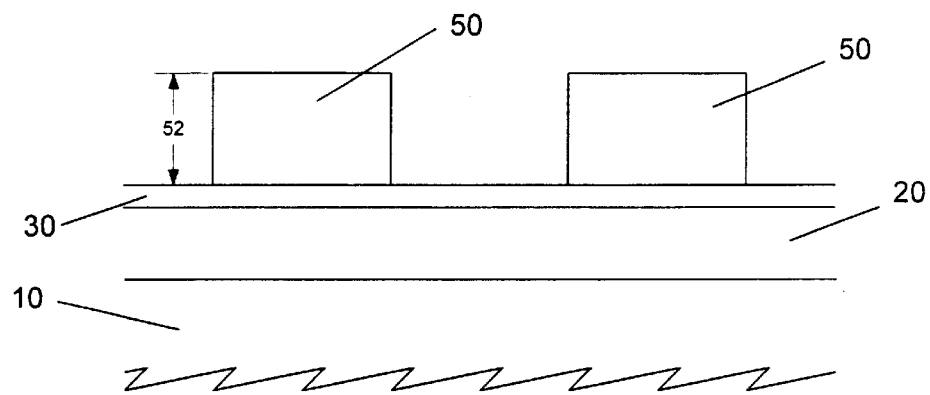
FIGS. 1a and 1b are cross-sectional views of a portion of a semiconductor integrated circuit depicting portions of a patterned photoresist layer.

In FIG. 1a, a cross-sectional view of an embodiment of a semiconductor integrated circuit depicting a patterned photoresist layer is shown. A metal layer 20 is represented overlying a semiconductor substrate 10. Metal layer 20 encompasses aluminum, copper or any of the alloys of aluminum and copper as are known. In addition, layer 20 includes any of the known multilayer metal films, for example an aluminum film overlying a barrier layer of titanium nitride (TiN).

Layer 30 is an anti-reflective coating (ARC). Such ARC layers 30 are used to reduce or eliminate the effects of standing waves formed by reflections during exposure of the photoresist layer (not shown) from which photoresist portions 50 are formed. As known, the use of ARC layers often improves the resolution of an image projected onto the photoresist layer for forming portions 50. As depicted, ARC layer 30 is an inorganic material, for example TiN or titanium tungsten (TiW), and is patterned with underlying metal layer 20. In some embodiments an organic ARC layer (not shown) is used. Typically, such organic ARC layers are patterned when the photoresist layer is developed to form portions 50. Finally, in some embodiments of the present invention, no ARC layer 30 is employed.

Photoresist portions 50 are formed by projecting an image onto the photoresist layer (not shown) and subsequently developing that image. Portions 50 can be formed from a variety of materials. Typically, such materials are sensitive to a specific, narrow range of the electromagnetic spectrum. For example, some photoresist materials are sensitive to the mercury vapor I-line at 365 nanometers (nm), while other materials are sensitive to what is known as the deep ultra violet (DUV) range at about 245 nm. While in some embodiments of the present invention, an I-line photoresist material having a thickness 52 of approximately 1.3 micron ($\mu$m) or a DUV sensitive photoresist material having a thickness 52 of approximately 1.0 μm is employed, it will be understood that embodiments of the present invention also encompass other appropriate photosensitive materials and thicknesses; for example, G-line (436 nm) and electron beam resist materials.

Still referring to FIG. 1a, semiconductor substrate 10 is depicted as having a minimum of complexity for simplicity and ease of understanding only. Thus it is understood that embodiments of the present invention include alternate substrates 10 having a variety of complexity. For example, in some embodiments substrate 10 is an N-type or P-type substrate, or is an N-type or P-type substrate encompassing N and/or P-type well regions (not shown) and/or an epitaxial layer (not shown). Alternatively, in some embodiments, substrate 10 encompasses a silicon on insulator (SOI) structure, or any other appropriate semiconductor substrate material or structure.

Figure 1B:
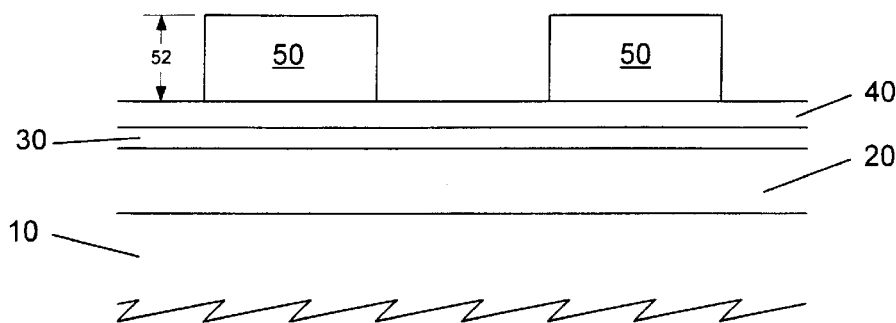

Turning now to FIG. 1b, another embodiment of the present invention is depicted incorporating an isolation/capping layer 40. As known, some photosensitive materials are not compatible with some ARC materials. Thus where photoresist portions 50 are to be formed, for example of a DUV photoresist material, a TiN or TiW ARC layer 30 will typically interact with the DUV photoresist material if direct contact between the materials occurs. Hence to prevent this interaction between the ARC material and DUV photoresist, capping/isolation layer 40 is used. An additional benefit of capping layer 40 is to provide for improved adhesion of the DUV photoresist than would be possible if the DUV photoresist were disposed directly on ARC layer 30. Generally layer 40 is a silicon oxide material formed by chemical vapor deposition or other appropriate method and has a thickness of between 10 to 80 nm. However, other materials, for example a silicon oxynitride, can also be advantageously employed.

Thus, FIGS. 1a and 1b, as described, are representative of a photoresist pattern, prior to etching the underlying metal layer 20. In addition, it will be understood that both FIGS. 1a and 1b are consistent with semiconductor processing as known and serve as common points from which prior art processes and embodiments of the present invention diverge.

Figure 2:
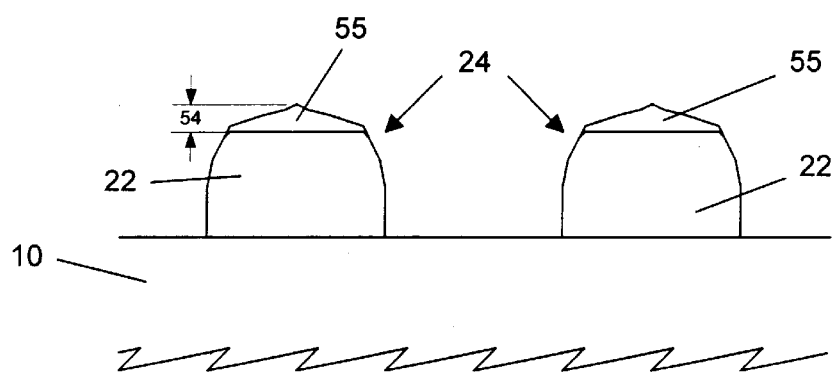
FIG. 2 is a cross-sectional view of a portion of a semiconductor integrated circuit showing an etched pattern having severe photoresist degradation in a manner common to the prior art.

Turning now to FIG. 2, a cross-sectional view of a portion of a semiconductor integrated circuit showing an etched pattern having severe photoresist degradation is depicted. FIG. 2 is meant to be representative of the structures of FIGS. 1a and/or 1b after etching of layer 20 to form metal portions 22 in the manner of the prior art. As shown, after etch, residual photoresist portions 55 are markedly changed with respect to portions 50 as depicted in FIGS. 1a and/or 1b. The essentially square corners of portions 50 (FIGS. 1a and 1b) are gone and residual thickness 54 is significantly less than thickness 52 (FIGS. 1a and 1b). As shown, the severe degradation depicted by portions 55 results in associated degradation of metal portions 22. For example, corners 24 are deformed from the original shape of photoresist portions 50. While not shown, it has been reported that some processes for etching metal layer 20 to form metal portions 22 will remove essentially all of original photoresist portions 50 resulting in metal portions 22 with severe deformations. Thus it can be seen that a method for preventing such severe deformation of photoresist portions 50 (FIGS. 1a and 1b) is desirable.

Figure 3A:
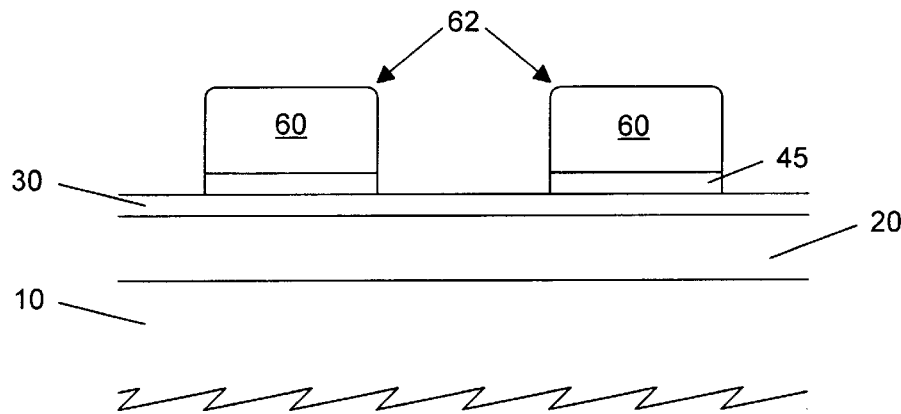
FIGS. 3a and 3b are cross-sectional views of the portion of the semiconductor integrated circuit depicted in FIGS. 1a and/or 1b at subsequent stages of a process in accordance with the present invention.

FIG. 3a is a cross-sectional view of the portion of the semiconductor integrated circuit depicted in FIG. 1b after a plasma treatment in accordance with embodiments of the present invention. Photoresist portions 60 are depicted overlying patterned isolation portions 45, ARC layer 30, metal layer 20 and substrate 10. It should be noted that while treated photoresist portions 60 are depicted having rounded corners 62, this representation is presented solely to distinguish treated portions 60 from untreated portions 50 (FIGS. 1a and 1b). Thus after treatment, photoresist portions 60 may or may not have such rounded corners 62.

In some embodiments of the present invention after photoresist portions 50 (FIG. 1b) are defined, substrate 10 is positioned in a vacuum chamber (not shown) and treated with a plasma for a predetermined time. For example, in some embodiments a plasma formed from fluoroform ($CHF_3$), carbon tetrafluoride ($CF_4$), nitrogen ($N_2$) and argon (Ar) is ignited in a vacuum chamber at a pressure of between approximately 100 to 300 milliTorr (mT) using between approximately 100 to 600 watts (W) of electrical energy. Once ignited, the plasma is maintained for a predetermined time sufficient to adequately treat portions 50 and form treated photoresist portions 60. It has been found that a time of between approximately 5 to 20 seconds (sec) is appropriate. It will be understood that the above mentioned ranges for pressure, electrical energy and time are dependent upon, among other things, the specific resist employed for portions 50. Thus, these ranges are given for illustrative purposes and are not intended to be limiting. Rather, any appropriate combination of pressure, electrical energy and time that results in forming treated photoresist portions 60 is within both the scope and spirit of the present invention.

It will also be understood that within each appropriate gas mixture used for forming treated portions 60, the specific ratio of the individual components of the mixture can vary to meet specific requirements. Therefore, some embodiments of the present invention encompass gas mixtures of $CHF_3$ with a flow rate of between approximately 30 to 60 standard cubic centimeters per minute (sccm), $CF_4$ with a flow rate between approximately 0 to 40 sccm, $N_2$ with a flow rate of between approximately 10 to 40 sccm and Ar with a flow rate of between approximately 150 to 450 sccm. It will be understood that, as for the other ranges previously mentioned, the above flow rate ranges are likely to be different where different resist materials are used for forming photoresist portions 50 (FIG. 1b). Thus, these flow rate ranges are given for illustrative purposes and are not intended to be limiting. Hence, any appropriate combination of pressure, electrical energy, time and gas flow rates that results in forming treated photoresist portions 60 is within both the scope and spirit of the present invention.

Still referring to FIG. 3a, it has been found that for embodiments having a silicon oxide or silicon oxynitride isolation/capping layer 40 (FIG. 1b), the above described plasma treatment for forming treated portions 60 also serves to etch layer 40 to form etched isolation portions 45. Thus, in some embodiments of the present invention a plasma is maintained in the vacuum chamber for a predetermined time sufficient to both form isolation/capping portions 45 and treated photoresist portions 60, respectively. For example, where photoresist portions 50 (FIG. 1b) are a DUV resist material and isolation layer 40 is a silicon oxide material having a thickness of approximately 20 nm, it has been found that 15 sec in a plasma formed from a gas mixture of 50 sccm $CHF_3$, 20 sccm $N_2$ and 300 sccm Ar, at a pressure of approximately 150 mT and at 500 W of electrical energy advantageously form treated portions 60.

Figure 3B:
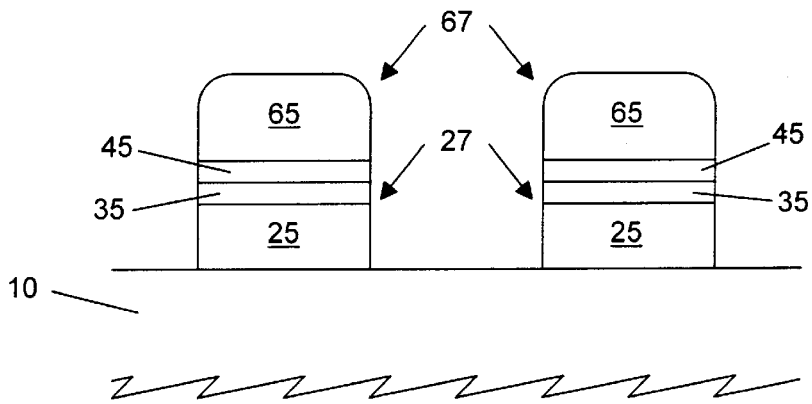

Turning now to FIG. 3b, the structure of FIG. 3a is depicted subsequent to etching ARC layer 30 and metal layer 20 to form patterned ARC portions 35 and metal portions 25. In addition, treated photoresist portions 60 (FIG. 3a) are represented as post-etch photoresist portions 65 having rounded corners 67. While the exact shape of post-etch portions 65 vary, as represented herein, post-etch portions 65 retain most of their original shape after metal etch. As a result of retaining the integrity of the photoresist pattern, the dimensions of the underlying metal portions 25 are much improved as compared to prior art metal portions 22 (FIG. 2).

Thus it can be seen that embodiments in accordance with the present invention have been described that provide for retaining the integrity of a photoresist pattern during a subsequent plasma etch process. It is known that metal etch processes employed in the semiconductor arts require some interaction with the photoresist to attain the highest anisotropic character. Thus it is significant that embodiments of the present invention allow for sufficient interaction with the photoresist to provide this anisotropy, while not allowing degradation to the degree common in the prior art. It will also be understood that embodiments of the present invention have been described that are readily integrated into a typical semiconductor fabrication process. For example, in some embodiments of the present invention the aforementioned plasma treatment is accomplished using a standard oxide etch system, for example a LAM® 4520 or the like (LAM is a registered trademark of LAM Research, Inc., Fremont, Calif.), while in some embodiments the plasma treatment is incorporated as a preliminary step of a monolithic metal etch process.

In addition, it will be realized that embodiments of the present invention incorporate various combinations of photoresist materials and ARC materials both with and without a capping or isolation layer. Thus, for example, in some embodiments an I-line resist material is used with both a capping layer and an ARC layer, while other embodiments incorporate a DUV resist material, an organic ARC material and no capping layer.

We claim:

1. A method for retaining the integrity of a photoresist pattern comprising:
    patterning a photosensitive material to form photoresist portions overlying a semiconductor substrate, said substrate including at least one layer of material formed thereon; and
    treating said photoresist portions with a plasma derived from a fluorocarbon to form etch resistant photoresist portions,
    said treating of said etch resistant photoresist portions including simultaneously etching of at least one layer disposed on said semiconductor substrate.

2. The method of claim 1 wherein patterning said photosensitive material comprises patterning an I-line sensitive material or a DUV sensitive material.

3. The method of claim 2 wherein forming photoresist portions overlying a semiconductor substrate comprises forming photoresist portions overlying a metal layer.

4. The method of claim 3 wherein forming photoresist portions overlying a metal layer comprises forming photoresist portions overlying an anti-reflective coating layer disposed on said metal layer.

5. The method of claim 4 wherein patterning said photoresist material comprises patterning an I-line photoresist material.

6. The method of claim 4 wherein forming said anti-reflective coating layer on said metal layer comprises forming an isolation/capping layer disposed on said anti-reflective coating layer.

7. The method of claim 6 wherein patterning said photoresist material comprises patterning a DUV photoresist material.

8. The method of claim 4 wherein treating said photoresist portions with a plasma derived from a fluorocarbon comprises creating a plasma derived from a fluorocarbon comprising $CHF_3$ or a mixture of $CHF_3$ and $CF_4$.

9. The method of claim 4 wherein treating said photoresist portions with a plasma derived from a fluorocarbon comprises creating a plasma derived from a gas mixture comprising $CHF_3$, $N_2$ and Ar.

10. The method of claim 9 wherein said etching of at least one layer, comprises etching of an isolation/capping layer disposed on said anti-reflective coating layer.

11. The method of claim 9 wherein creating a plasma derived from a gas mixture comprising $CHF_3$, $N_2$ and Ar comprises creating said plasma at a pressure between approximately 100 to 300 milliTorr with approximately 100 to 600 watts of electrical energy.

12. The method of claim 11 wherein treating said photoresist portions with a plasma comprises maintaining said plasma for between approximately 5 to 20 seconds.

13. The method of claim 11 wherein creating a plasma derived from a gas mixture comprising $CHF_3$, $N_2$ and Ar comprises creating said plasma at a pressure of approximately 150 milliTorr with approximately 500 watts of electrical energy.

14. The method of claim 13 wherein treating said photoresist portions with a plasma comprises maintaining said plasma for approximately 15 seconds.

15. A method for patterning a metal layer overlying a semiconductor substrate comprising:
    forming a patterned layer of photosensitive material overlying a metal layer disposed on said substrate;
    treating said patterned layer of photosensitive material with a plasma derived from a gas mixture comprising $CHF_3$, said treating of said patterned layer of photosensitive material including simultaneously etching of an isolation/capping layer disposed on said metal layer to expose portions of said metal layer; and
    etching said metal layer to remove said exposed portions of said metal layer.

16. The method of claim 15 wherein forming a patterned layer of photosensitive material comprises forming said patterned layer of an I-line sensitive material or a DUV sensitive material.

17. The method of claim 15 wherein treating said patterned layer of photosensitive material with a plasma derived from a gas mixture comprising $CHF_3$ comprises igniting said plasma at a pressure between about 100 to 300 milliTorr.

18. The method of claim 15 wherein treating said patterned layer of photosensitive material with a plasma derived from a gas mixture comprising $CHF_3$ comprises using between about 100 to 600 watts of electrical energy to ignite said plasma.

19. A method for retaining the integrity of a photoresist pattern comprising:
    forming a pattern of photosensitive resist over a metal layer disposed on a substrate wherein portions of said metal layer are exposed;
    treating said pattern of photosensitive resist with a plasma derived from a fluorocarbon to form etch resistant resist; and
    etching an isolation/protection layer disposed on said exposed portions of said metal layer, simultaneously with said treating said pattern of photosensitive resist with said plasma.

* * * * *